United States Patent
Evans et al.

(10) Patent No.: US 9,685,303 B2
(45) Date of Patent: *Jun. 20, 2017

(54) APPARATUS FOR HEATING AND PROCESSING A SUBSTRATE

(71) Applicant: Varian Semiconductor Equipment Associates, Inc., Gloucester, MA (US)

(72) Inventors: Morgan D. Evans, Manchester, MA (US); Jason M. Schaller, Austin, TX (US); D. Jeffrey Lischer, Acton, MA (US); Ala Moradian, Beverly, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 67 days.

This patent is subject to a terminal disclaimer.

(21) Appl. No.: 14/707,025

(22) Filed: May 8, 2015

(65) Prior Publication Data
US 2016/0329190 A1 Nov. 10, 2016

(51) Int. Cl.
*H01J 37/317* (2006.01)
*H01J 37/20* (2006.01)

(52) U.S. Cl.
CPC .......... *H01J 37/3171* (2013.01); *H01J 37/20* (2013.01); *H01J 2237/2001* (2013.01)

(58) Field of Classification Search
CPC .......... H01J 2237/20; H01J 2237/2001; H01J 2237/2002; H01J 37/20; H01J 37/3171; H01J 37/3174; H01J 37/3177; H01L 21/265; H01L 21/324; H01L 21/67; H01L 21/6776

See application file for complete search history.

(56) References Cited

U.S. PATENT DOCUMENTS

| | | | |
|---|---|---|---|
| 4,356,384 A | 10/1982 | Gat | |
| 5,262,870 A | 11/1993 | Nakamura et al. | |
| 7,427,145 B2 | 9/2008 | Jang et al. | |
| 8,404,499 B2 | 3/2013 | Moffatt | |

(Continued)

FOREIGN PATENT DOCUMENTS

| | | |
|---|---|---|
| CN | 103177996 A | 6/2013 |
| JP | 2002-175772 A | 6/2002 |

(Continued)

OTHER PUBLICATIONS

International Search Report and Written Opinion mailed Jul. 29, 2016 in corresponding PCT application No. PCT/US2016/029316.

(Continued)

*Primary Examiner* — David E Smith
(74) *Attorney, Agent, or Firm* — Nields, Lemack & Frame, LLC (57) ABSTRACT

A system and method for heating a substrate while that substrate is being processed by an ion beam is disclosed. The system comprises two arrays of light emitting diodes (LEDs) disposed above and below the ion beam. The LEDs may be GaN or GaP LEDs, which emit light at a wavelength which is readily absorbed by silicon, thus efficiently and quickly heating the substrate. The LED arrays may be arranged so that the ion beam passes between the two LED arrays and strikes the substrate. As the substrate is translated relative to the ion beam, the LEDs from the LED arrays provide heating to the substrate.

17 Claims, 4 Drawing Sheets

(56) References Cited

U.S. PATENT DOCUMENTS

| | | | |
|---|---|---|---|
| 9,287,148 B1* | 3/2016 | Evans | H01L 21/6776 |
| 2002/0000521 A1 | 1/2002 | Brown | |
| 2002/0066411 A1 | 6/2002 | Chiang et al. | |
| 2003/0160255 A1 | 8/2003 | Taninaka et al. | |
| 2006/0051077 A1 | 3/2006 | Kubo | |
| 2008/0226272 A1* | 9/2008 | Kasai | H01L 21/2686 392/418 |
| 2008/0268553 A1 | 10/2008 | Chan et al. | |
| 2009/0260570 A1* | 10/2009 | Aoki | C23C 14/541 118/723 R |
| 2012/0127376 A1 | 5/2012 | Shikina | |
| 2013/0052834 A1 | 2/2013 | Kielwein et al. | |
| 2013/0126509 A1 | 5/2013 | He et al. | |
| 2014/0061180 A1 | 3/2014 | Petry et al. | |
| 2014/0263271 A1* | 9/2014 | Sheelavant | H01L 21/67115 219/443.1 |
| 2015/0064887 A1* | 3/2015 | Manabe | H01J 37/243 438/514 |
| 2015/0155172 A1* | 6/2015 | Breil | H01L 21/268 438/530 |
| 2015/0289318 A1* | 10/2015 | Wang | H01L 21/67115 438/795 |

FOREIGN PATENT DOCUMENTS

| | | |
|---|---|---|
| JP | 2006-013211 A | 1/2006 |
| WO | 2014/190675 A1 | 12/2014 |

OTHER PUBLICATIONS

Notice of Allowance mailed Mar. 1, 2017 in co-pending U.S. Appl. No. 14/688,000.

International Search Report and Written Opinion mailed Jul. 14, 2016 in co-pending PCT application No. PCT/US2016/025998.

Lee et al., "The Grand Challenges of Plasma Etching: A Manufacturing Perspective," Journal of Physics D: Applied Physics, vol. 47, pp. 1-9, 2014.

Shen et al., "Etch Planarization—A New Approach to Correct Non-Uniformity Post Chemical Mechanical Polishing,", Advanced Semiconductor Manufacturing Conference, May 2014, pp. 423-427, IEEE.

Office action mailed Oct. 24, 2016 in co-pending U.S. Appl. No. 14/688,000.

* cited by examiner

APPARATUS FOR HEATING AND PROCESSING A SUBSTRATE

FIELD

Embodiments of the present disclosure relate to techniques and apparatus for heating and processing a substrate, and more particularly, for heating a substrate while the substrate is being processed by an ion beam.

BACKGROUND

The fabrication of a semiconductor device involves a plurality of discrete and complex processes. The semiconductor substrate typically undergoes many processes during the fabrication process. Some of these processes may involve processing the substrate using an ion beam. For example, the substrate may be implanted with ions from the ion beam. In another embodiment, an ion beam may be used to perform an etching, amorphization or deposition process.

In certain embodiments, it may be beneficial to process the substrate while the substrate is at an elevated temperature. This may be achieved by disposing the substrate on a heated platen, which maintains the substrate at the elevated temperature. To process the substrate, the ion beam and the platen are then moved relative to one another. For example, in some embodiments, the ion beam may be a ribbon beam which extends across the diameter of the substrate. In this embodiment, the ion beam may remain stationary while the platen is translated in a direction perpendicular to the width of the ion beam. Alternatively, the substrate may remain stationary while the ion beam is translated in a direction perpendicular to its width.

However, a substrate subject to an ion implantation at an elevated temperature may be subject to three different types of temperature non-uniformity. First, there may be temporal non-uniformity, where the substrate is cooler during the initial portion of the implantation process than during the remainder of the process. This may be due to the time for the platen to elevate the temperature of the substrate. This may also be due to the fact that the ion beam imparts heat to the substrate, which is not present before implanting begins. Second, there may be spatial non-uniformity. The center of the substrate may be at a higher temperature than the outer edge of the substrate. This may be due to the fact that the outer edge of the substrate is not in contact with the platen in typical configurations. Third, there may be differences in the temperature variation. For example, the center of the substrate may remain closer to the target temperature, such as +/−7° C., while the outside of the substrate may experience temperature excursions of greater than 20° C.

Thus, it would be beneficial if there were a technique and an apparatus to reduce these sources of temperature non-uniformity that occur during the processing of substrates. Further, it would be advantageous if the apparatus were easily added to existing implantation systems. Further, it would be beneficial if the apparatus were less expensive and more reliable than existing systems.

SUMMARY

A system and method for heating a substrate while that substrate is being processed by an ion beam is disclosed. The system comprises two arrays of light emitting diodes (LEDs) disposed above and below the ion beam, respectively. The LEDs may be GaN or GaP LEDs, which emit light at a wavelength which is readily absorbed by silicon, thus efficiently and quickly heating the substrate. The LED arrays may be arranged so that the ion beam passes between the two LED arrays and strikes the substrate. As the substrate is translated relative to the ion beam, the LEDs from the LED arrays provide heating to the substrate.

In a first embodiment, a substrate heating and processing system is disclosed. The system comprises a first LED array and a second LED array, each comprising a plurality of LEDs, disposed between an ion source and a substrate; wherein an ion beam passes between the first LED array and the second LED array, and the first LED array and the second LED array are disposed on opposite sides of the ion beam in a first direction. In certain embodiments, the system further comprises a platen on which the substrate may be disposed, the platen configured to be translated relative to the ion beam in the first direction. In certain embodiments, the ion beam is a ribbon ion beam having a width greater than its height and greater than the diameter of the substrate, and the first direction is a height direction. In certain embodiments, the plurality of LEDs emit light at a wavelength absorbed by the substrate. In certain embodiments, this wavelength may be between 0.4 µm and 1.0 µm.

In a second embodiment, a substrate heating and processing system is disclosed. The system comprises a platen on which a substrate may be disposed, the platen configured to be translated relative to an ion beam; a temperature sensor disposed on the platen; a first LED array and a second LED array, each comprising a plurality of LEDs, disposed between an ion source and the platen and wherein the ion beam passes between the first LED array and the second LED array; and a controller, in communication with the temperature sensor, wherein the controller determines a power level to apply to the plurality of LEDs based on information from the temperature sensor and a target substrate temperature. In certain embodiments, the power level applied to the plurality of LEDs by the controller varies based on a position of the platen relative to the ion beam. In certain embodiments, the plurality of LEDs emit light at a wavelength between 0.4 µm and 1.0 µm.

In a third embodiment, a substrate heating and processing system is disclosed. The system comprises a platen on which a substrate may be disposed, the platen configured to be translated relative to an ion beam; a first LED array and a second LED array, each comprising a plurality of LEDs, disposed between an ion source and the platen and wherein the ion beam passes between the first LED array and the second LED array; and a controller, wherein the controller determines a power level to apply to the plurality of LEDs based on one or more operating parameters. In certain embodiments, the one or more operating parameters are selected from the group consisting of target substrate temperature, platen temperature, ion beam energy, substrate material and scan rate. In certain embodiments, the plurality of LEDs emit light at a wavelength between 0.4 µm and 1.0 µm.

BRIEF DESCRIPTION OF THE FIGURES

For a better understanding of the present disclosure, reference is made to the accompanying drawings, which are incorporated herein by reference and in which.

DETAILED DESCRIPTION

As described above, in many applications, it is advantageous to heat a substrate while that substrate is being processed. Therefore, a system that can be used to uniformly heat substrates while the substrates are being processed by an ion beam would be beneficial.

A substrate is typically disposed on a platen, such as an electrostatic clamp. The substrate is typically translated relative to an ion beam so as to scan the entire substrate. In some embodiments, a ribbon ion beam is employed, where the width of the ribbon ion beam is much greater than its height. Further, the width of the ribbon ion beam is typically greater than the diameter of the substrate. In this embodiment, the substrate is simply translated along the height direction, so that all of the substrate is exposed to the ribbon ion beam over time. This may be done by translating the substrate while holding the ribbon ion beam fixed in position. Alternatively, the substrate may be held stationary while the ribbon ion beam is translated in the height direction.

Alternatively, a spot ion beam may be used. A spot ion beam, as the name suggested, is more circular in shape. In this embodiment, the spot ion beam is typically translated in one direction, such as the width direction, while the substrate is translated in the height direction.

Figure 1:
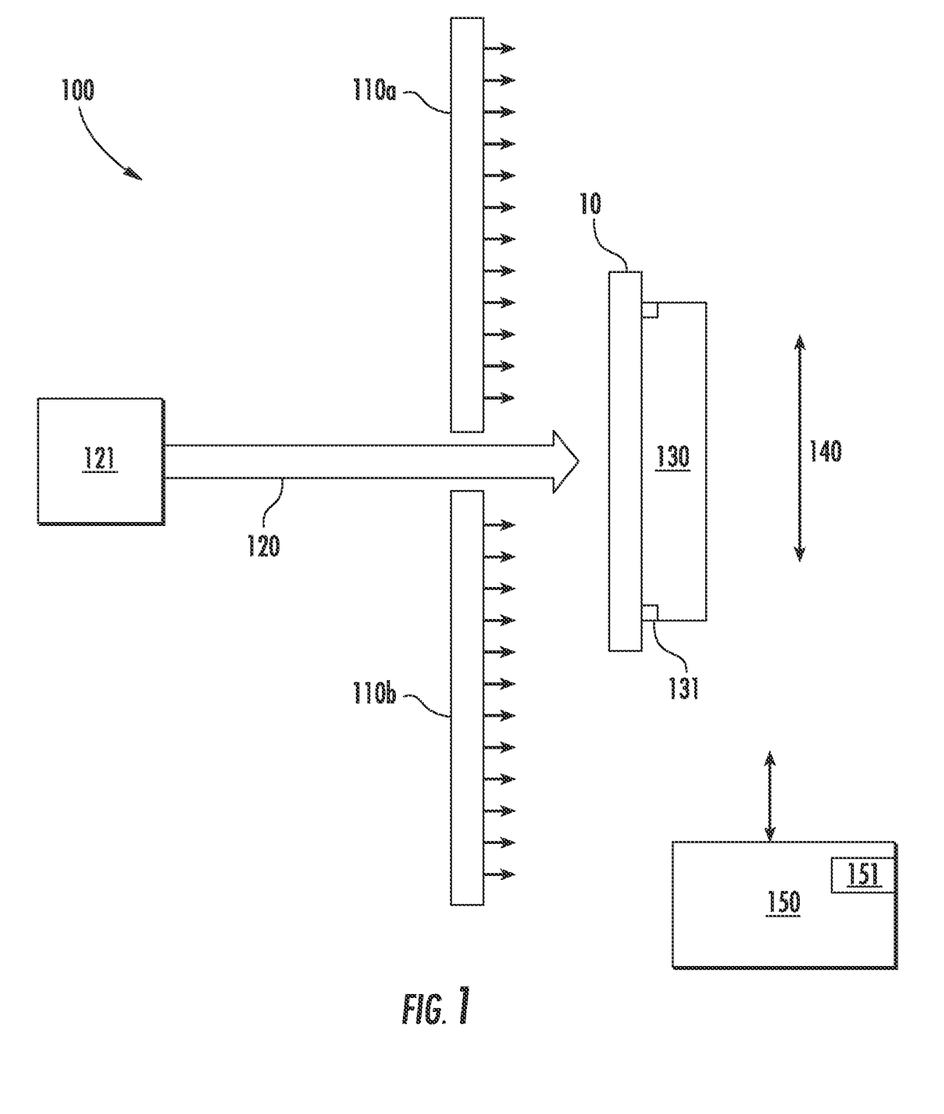
FIG. 1 is a side view of a substrate heating and processing system according to one embodiment.

FIG. 1 shows a first embodiment of the substrate heating system. In this embodiment, the substrate heating and processing system 100 comprises a first LED array 110a and a second LED array 110b. The first LED array 110a is disposed above the path of the ion beam 120, while the second LED array 110b is disposed below the path of the ion beam 120. The ion beam 120 may be generated using an ion source 121. The ion source 121 may be any suitable source, such as but not limited to a beam-line ion implantation system. The ion source may also be a plasma chamber from which the ion beam 120 is extracted. As such, the disclosure is not limited to any particular ion source.

The space or gap between the first LED array 110a and the second LED array 110b may be slightly greater than the height of the ion beam 120, such that the ion beam 120 does not strike the LED arrays. For example, in certain embodiments, the ion beam may have a height of 3 cm and the gap between the LED arrays may be about 5 cm. Of course, other dimensions are within the scope of the disclosure. In certain embodiments, the back surface of the LED arrays may be covered with a material that may withstand ion beam strike, such as graphite.

The first LED array 110a and the second LED array 110b may each comprise a plurality of high power LEDs, which emit light of a wavelength or a plurality of wavelengths that is readily absorbed by the substrates. For example, silicon exhibits high absorptivity and low transmissivity in the range of wavelengths between about 0.4 and 1.0 μm. Silicon absorbs more than 50% of the energy emitted in the range of wavelengths from 0.4 to 1.0 μm. LEDs that emit light in this range of wavelengths may be used. In certain embodiments, LEDs made from GaN are employed. These GaN LEDs emit light at a wavelength of about 450 nm. In other embodiments, LEDs made from GaP are employed. These GaP LEDs emit light at a wavelength of between 610 Nm and 760 nm.

The LEDs which make up the LED arrays may be varied in size. In certain embodiments, each LED may be 1.3 mm×1.7 mm. In another embodiment, each LED may be 1 mm×1 mm. Of course, LEDs of other dimensions are also within the scope of the disclosure. The density of the LEDs in the LED arrays may vary. For example, in one embodiment, a density of 8.65 LEDs/cm$^2$ may be used. In another embodiment, a density of 18.1 LEDs/cm$^2$ may be used. In other embodiments, densities of up to 78 LEDs/cm$^2$ may be used. As such, the density of the LED arrays is not limited by the disclosure.

The LEDs in the first LED array 110a and the second LED array 110b may be divided into a plurality of zones. Each zone may be operated as a single entity such that the same power level and timing is applied to all LEDs in a particular zone. For example, in certain embodiments, the LEDs may be arranged into zones where each of the zones may be a horizontal stripe. Of course, other configurations are also possible. Further, each zone may comprise an arbitrary number of LEDs. In certain embodiments, each LED may be treated as an individual zone.

A substrate 10 is disposed on a platen 130, such as an electrostatic clamp. The first LED array 110a and the second LED array 110b are disposed so as to be between the ion beam source and the substrate 10. Further, as described above, the first LED array 110a and the second LED array 110b are disposed such that the ion beam passes 120 between them.

The platen 130 may be translated in a direction 140 which is perpendicular to the longer dimension of the ion beam 120. For example, if ion beam 120 is a ribbon ion beam having a width much greater than its height, the platen 130 is translated in the height direction. In the case where a spot ion beam is used, the platen 130 may be translated in direction 140, while the spot ion beam is translated in the width direction, perpendicular to direction 140. The speed at which the substrate 10 is translated is a design consideration and is not limited by this disclosure. The substrate 10 may be translated by an actuator in communication with the platen 130. Alternatively, the substrate 10 may remain stationary while the ion beam 120 is translated in a direction 140, which is perpendicular to its width. Thus, in either embodiment, relative translation exists between the platen 130 and the ion beam 120.

As described, the LED arrays are disposed on opposite sides of the ion beam 120. In embodiments where a ribbon beam is used, the LED arrays are disposed on opposite sides of the ion beam 120 in the height direction, or direction 140. In embodiments where a spot ion beam is used, and the spot beam is translated in a first direction, while the platen is translated in direction 140, the LED arrays are disposed on opposite sides of the ion beam 120 in direction 140. In other words, the LED arrays are disposed on opposite sides of the ion beam in the direction in which the relative translation occurs.

The LED arrays may be disposed a predetermined distance from the platen 130, such as between 1 and 10 cm. The LED arrays may be part of a printed circuit board (PCB), which both feeds power to the LEDs and removes heat from the LEDS. In certain embodiments, the PCB may be in thermal communication with a heat sink, such as an aluminum block. In some embodiments, the heat sink is liquid cooled to maintain the LED arrays below a predetermined temperature, such as about 120° C. For example, the aluminum block may be water cooled.

In certain embodiments, a controller 150 may be used to control the illumination and turning off of the LEDs in the first LED array 110a and the second LED array 110b. The controller 150 includes a processing unit and one or more storage elements 151. The storage element 151 may be used to store instructions that allow the controller 150 to execute the processes and methods described herein.

Figure 2:
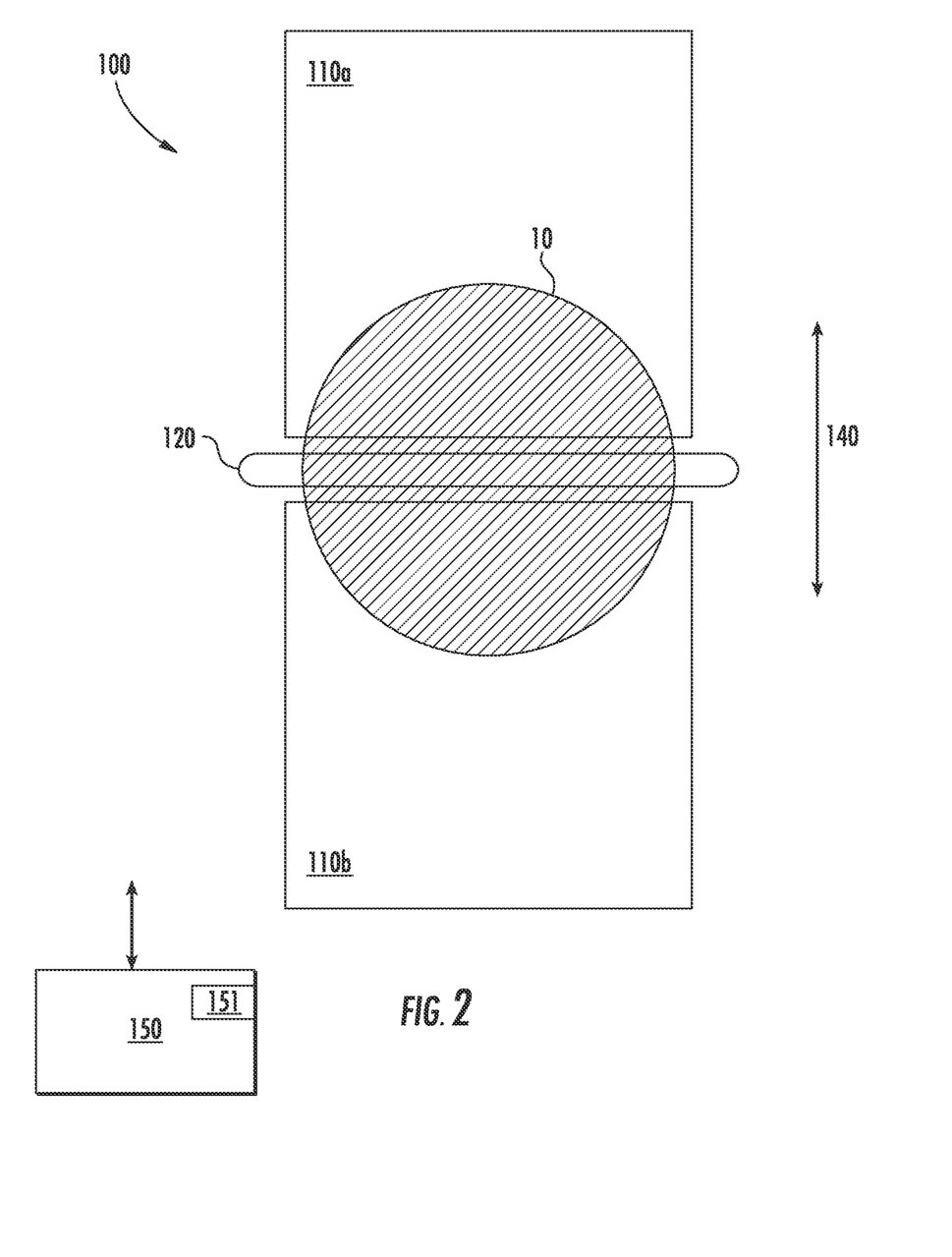
FIG. 2 is a front view of a substrate heating and processing system according to one embodiment.

FIG. 2 shows a front view of the substrate heating and processing system 100 and the substrate 10. As described above, the ion beam 120 is disposed between the first LED array 110a and the second LED array 110b. Although a ribbon ion beam is shown in FIG. 2, it is understood that a spot ion beam may also be used with the present substrate heating and processing system 100. The spot ion beam may move laterally in the gap between the first LED array 110a and the second LED array 110b. In certain embodiments, the width of the first LED array 110a and the second LED array 110b is greater than the diameter of the substrate 10, such that the substrate 10 is always disposed behind the LED arrays. In certain embodiments, the height of each LED array may also be greater than the diameter of the substrate 10. This allows the substrate 10 to be scanned in direction 140 beyond the ion beam 120 and still remain completely disposed behind the LED arrays.

Figure 3A:
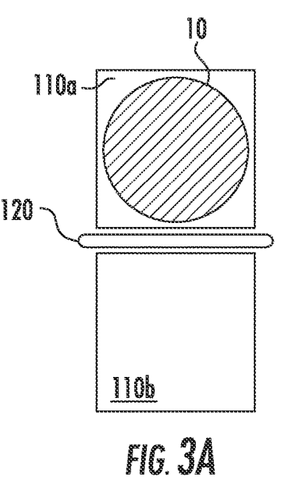
FIGS. 3A-3E show a sequence where a substrate is processed by an ion beam.
Figure 3B:
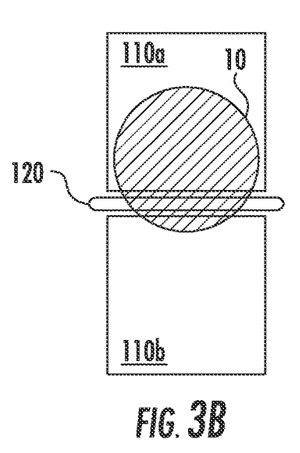
Figure 3C:
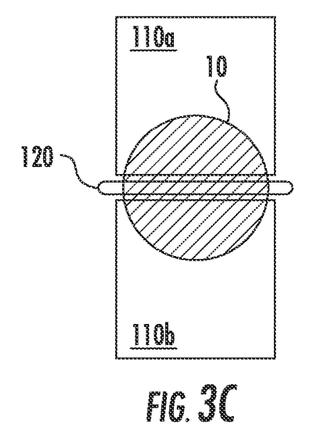
Figure 3D:
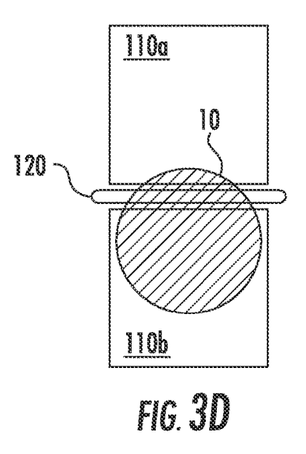
Figure 3E:
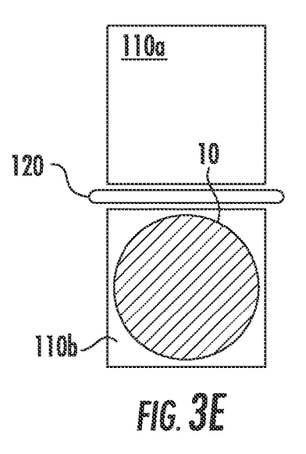

FIGS. 3A-E show a sequence wherein the substrate 10 is being implanted by ion beam 120. In FIG. 3A, the substrate 10 is completely above the ion beam 120. In this embodiment, the substrate 10 is disposed behind first LED array 110a, such that light from the LEDs in the first LED array 110a illuminates the entirety of the substrate 10. In other words, even though the substrate is not exposed to the ion beam 120, the substrate 10 is being uniformly heated by first LED array 110a. In FIG. 3B, the substrate 10 is translated downward relative to the ion beam 120 so that a portion of the substrate 10 is exposed to the ion beam 120. Note that a small portion of the substrate 10 is now disposed behind the second LED array 110b, while a larger portion of the substrate 10 is still disposed behind the first LED array 110a. In FIG. 3C, the center of the substrate 10 is exposed to the ion beam 120. In this position, an equal portion of the substrate 10 is disposed behind the first LED array 110a and the second LED array 110b. In this position, an upper portion of the substrate 10 is heated by the first LED array 110a, a lower portion of the substrate 10 is heated by the second LED array 110b, and the middle of the substrate 10 is heated by the ion beam 120. As the substrate 10 continues moving downward, a larger portion of the substrate 10 is disposed behind the second LED array 110b, as shown in FIG. 3D. Finally, in FIG. 3E, the entire substrate 10 is now disposed behind the second LED array 110b and is heated by the second LED array 110b. In this way, the substrate 10 is constantly exposed to the light from the LED arrays and may maintain a more uniform temperature profile. As the sequence continues, the platen 130 may move upward relative to the ion beam 120, repeating the positions of FIGS. 3A-3D, in reverse order.

This substrate heating and processing system 100 may also be used to eliminate the use of preheating stations. For example, the substrate 10 may be placed on the platen 130 in a position shown in FIG. 3A. The light from first LED array 110a may then be used to preheat the substrate 10 to the desired temperature prior to exposing the substrate 10 to the ion beam 120. Depending on the distance between the first LED array 110a and the substrate 10, as well as the density and power applied to the LEDs, the time to heat the substrate 10 may be less than one minute. This technique may reduce the temporal temperature non-uniformity described above. Of course, the substrate 10 may be placed on the platen 130 in the position shown in FIG. 3E as well.

Thus, in certain embodiments, the substrate 10 may be disposed on the platen 130 in a position such as that shown in FIG. 3A. After the substrate 10 reaches the target temperature, ion beam processing may begin, where the platen 130 is moved relative to the ion beam 120 in the height direction.

In some embodiments, heated platens may be used to perform substrate processing at elevated temperatures. For example, the platen 130 may incorporate heating elements such that the temperature of the platen 130 may be increased to 400° C. or more. The substrate heating and processing system 100 may be used in conjunction with such a heated platen to address the thermal non-uniformity issues described above. As such, the power level used by the LED arrays is set so as to supplement the heat being provided by the heated platen. For example, the platen 130 may supply the majority of the heat to the substrate 10, while the LED arrays are used to improve the temperature uniformity across the substrate 10 during processing. As described previous, there may be spatial temperature non-uniformity such that the center of the substrate 10 may be warmer than the outer edge of the substrate 10. Additionally, the temperature variation, or temperature swing, during processing may differ at different regions of the substrate 10. The use of the first LED array 110a and the second LED array 110b may help reduce the spatial temperature non-uniformity and the non-uniform temperature swing.

In another embodiment, substrate processing at elevated temperatures may be performed without the use of a heated platen. Rather, the first LED array 110a and the second LED array 110b are used to provide all of the heating to the substrate 10. As such, the power level of the LED arrays in this configuration may be much greater than that used in the previous embodiment where a heated platen was employed.

Figure 4A:
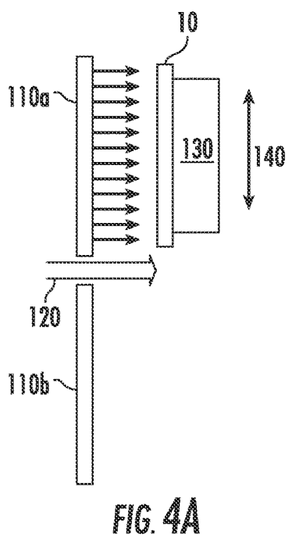
FIG. 4A-4E show a sequence where various zones of the LED arrays are illuminated based on a relative position of the platen.

The controller 150 may be used to control the actuation of the substrate heating and processing system 100. For example, in one embodiment, the first LED array 110a and the second LED array 110b may be divided into a plurality of zones. For example, the zones may be horizontal stripes or individual LEDs. In these embodiments, the controller 150 may actuate only those LEDs that are aligned with the substrate 10 at a particular point in time. In other words, the controller 150 controls the power level and illumination of LEDs within the LED arrays based on the position of the platen 130 relative to the ion beam 120. For example, referring to FIG. 4A, the controller 150 may disable all of the LEDs in the second LED array 110b because the substrate 10 is disposed entirely behind first LED array 110a. Similarly, all of the LEDs in the first LED array 110a may be actuated at this time.

Figure 4B:
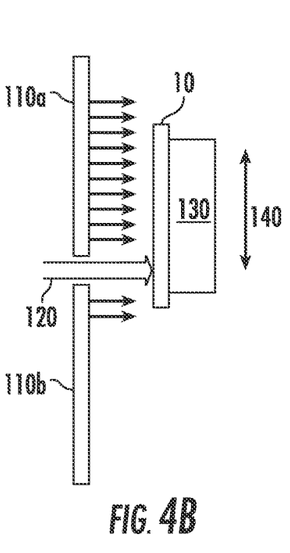
Figure 4C:
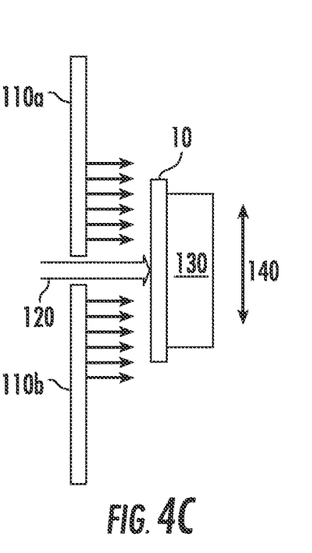
Figure 4D:
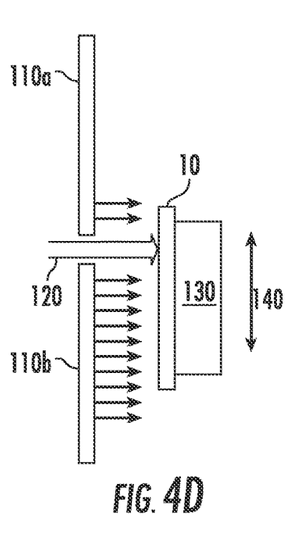
Figure 4E:
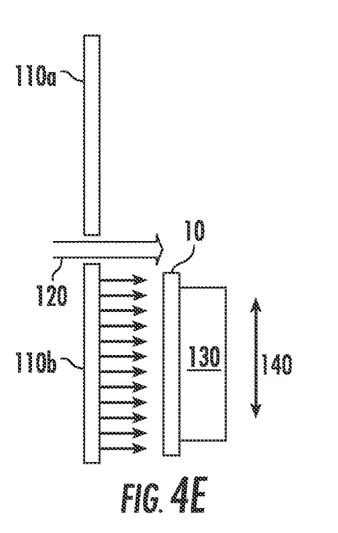

As the substrate 10 is translated relative to the ion beam 120 and the LED arrays, the controller 150 may actuate different zones on the LED arrays. For example, in FIG. 4B, the controller 150 may actuate the lower zones of the first LED array 110a, but turn off the uppermost zones of the first LED array 110a. Likewise, the controller 150 may turn off the lower zones of the second LED array 110b, but actuate the uppermost zones of the second LED array 110b. As the substrate 10 moves down relative to the LED arrays, the number of zones illuminated in the first LED array 110a may continue to decrease, while the number of zones illuminated in the second LED array 110b may increase. In FIG. 4C, the controller 150 may actuate the same number of zones in each LED array, as the substrate is in the center position. In FIG. 4D, more of the zones in the first LED array 110a are turned off, while more zones in the second LED array 110b are illuminated by the controller 150. In FIG. 4E, all of the zones in the second LED array 110b may be illuminated, while all of the zones in the first LED array 110a may be turned off.

By using the controller 150 to illuminate various zones, overall power consumption may be reduced without any effect on the heating of the substrate 10.

In addition to actuating certain zones, the controller 150 may be used to determine and apply an appropriate amount of power to each zone. For example, in certain embodiments, one or more temperature sensors 131 (see FIG. 1) may be disposed near the substrate 10. For example, temperature sensors 131 may be disposed on or near the top surface of the platen 130, so as to accurately determine the actual temperature of the substrate 10. Based on the target temperature of the substrate 10 and the actual temperature of the substrate 10, as measured by the temperature sensors 131, the controller 150 may adjust the amount of power applied to the various zones of the LED arrays. For example, the target temperature for the substrate 10 during the processing may be 500° C. By monitoring the actual temperature of the substrate 10 using information from the temperature sensors 131, the controller 150 may adjust the power level applied to the LED arrays to achieve this temperature. Thus, in certain embodiments, the controller 150 may employ closed loop control to regulate the temperature of the substrate 10. The controller 150 may also use information from the temperature sensors 131 during the preheating process to determine whether the substrate 10 has reached the target temperature prior to being subjected to ion beam processing.

In another embodiment, temperature sensors 131 may not be employed. In this embodiment, the controller 150 may determine the power level based on various operating parameters. These operating parameters may include, but are not limited to, the energy of the ion beam 120, the target temperature of the substrate 10, the material used for the substrate 10, the temperature of the platen 130 and the scan rate, which is the rate of relative translation in direction 140. For example, the controller 150 may include a storage element 151 that includes various profiles to be used with different operating parameters. For example, a matrix may exist in the storage element 151 that stores the power level to be applied based on various operating parameters. The values contained in the matrix may have been previously determined empirically and stored into the storage element 151. In another embodiment, the controller 150 may use an algorithm to determine the power level to be applied to the LED arrays based on the various operating parameters. Thus, in certain embodiments, the controller 150 may employ open loop control to regulate the temperature of the substrate 10.

In certain embodiments, the LED arrays may be used to warm a substrate 10 after processing. For example, in certain embodiments, a substrate 10 may be processed at a reduced temperature, such as 0° C. After the substrate 10 is processed, it may be beneficial to warm the substrate 10. This may reduce the possibility of condensation forming on the substrate 10 when the substrate 10 is removed from the processing chamber. In this embodiment, the platen 130 may be translated along direction 140, as shown in FIGS. 3A-3E. However, the LEDs in the first LED array 110a and the second LED array 110b are not actuated during the processing of the substrate 10. After the processing of the substrate 10 has completed, the platen 130 may move to the position shown in FIG. 3A, where the LEDs in the first LED array 110a are illuminated to warm the substrate 10.

The embodiments described above in the present application may have many advantages. First, heating of a substrate prior to or during processing is a common semiconductor fabrication process. By integrating the heating process with the scanning process, throughput of the processing chamber may be improved. Further, incorporation of the heating process with the scanning process also allows for the removal of preheating stations. These preheating stations consume space within the processing chamber.

Further, portions of the substrate 10 are being warmed by the LED arrays while other portions are being processed by the ion beam 120. Thus, the LED arrays may serve to reduce the temperature swing described above, as the entire substrate 10 is being constantly heated.

In addition, the LED arrays may be manufactured inexpensively. Therefore, in certain embodiments, the expensive heated platen used in high temperature processes may be replaced with a traditional platen. This may reduce cost and improve reliability.

Finally, in certain embodiments, the LED arrays extend beyond the outer edges of the substrate. Thus, the LED arrays may be used to correct the spatial temperature non-uniformity described above.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A substrate heating and processing system, comprising:
   a first LED array and a second LED array, each comprising a plurality of LEDs, disposed between an ion source and a substrate;
   wherein the first LED array and the second LED array are spaced apart so that an ion beam passes between the first LED array and the second LED array toward the substrate, and the first LED array and the second LED array are disposed on opposite sides of the ion beam in a first direction; and
   a platen on which the substrate may be disposed, the platen configured to be translated relative to the ion beam in the first direction, wherein spacing between the first LED array and the second LED array is such that the substrate is uniformly heated by the first LED array and the second LED array while being implanted by the ion beam.

2. The substrate heating and processing system of claim 1, wherein the ion beam is a ribbon ion beam, having a width greater than its height and greater than a diameter of the substrate, and the first direction is a height direction.

3. The substrate heating and processing system of claim 1, wherein the plurality of LEDs emit light at a wavelength absorbed by the substrate.

4. The substrate heating and processing system of claim 3, wherein the wavelength is between 0.4 and 1.0 μm.

5. The substrate heating and processing system of claim 1, further comprising a controller to control illumination and power applied to the plurality of LEDs so as to maintain the substrate at a uniform temperature as it moves in the first direction.

6. The substrate heating and processing system of claim 5, further comprising a temperature sensor disposed near the substrate to measure an actual temperature of the substrate.

7. The substrate heating and processing system of claim 6, wherein the controller uses the actual temperature of the substrate and a target temperature of the substrate to determine a power level to be applied to the plurality of LEDs.

8. The substrate heating and processing system of claim 5, wherein the controller uses information about operating parameters to determine a power level to be applied to the plurality of LEDs.

9. The substrate heating and processing system of claim 8, wherein the information is selected from the group consisting of target substrate temperature, platen temperature, ion beam energy, substrate material and scan rate.

10. The substrate heating and processing system of claim 1, wherein the ion beam is a spot ion beam, and the spot ion beam is translated in a second direction perpendicular to the first direction.

11. A substrate heating and processing system, comprising:
    a platen on which a substrate may be disposed, the platen configured to be translated relative to an ion beam;
    a temperature sensor disposed on the platen;
    a first LED array and a second LED array, each comprising a plurality of LEDs, disposed between an ion source and the platen and wherein the ion beam passes between the first LED array and the second LED array; and
    a controller, in communication with the temperature sensor, wherein the controller determines a power level to apply to the plurality of LEDs based on information from the temperature sensor and a target substrate temperature so as to maintain the substrate at a uniform temperature as the substrate is implanted by the ion beam.

12. The substrate heating and processing system of claim 11, wherein the power level applied to the plurality of LEDs by the controller varies based on a position of the platen relative to the ion beam.

13. The substrate heating and processing system of claim 11, wherein the plurality of LEDs emit light at a wavelength between 0.4 and 1.0 µm.

14. A substrate heating and processing system, comprising:
    a platen on which a substrate may be disposed, the platen configured to be translated relative to an ion beam;
    a first LED array and a second LED array, each comprising a plurality of LEDs, disposed between an ion source and the platen and wherein the ion beam passes between the first LED array and the second LED array; and
    a controller, wherein the controller determines a power level to apply to the plurality of LEDs based on one or more operating parameters, so as to maintain a uniform temperature profile of the substrate as the platen moves from a first side of the ion beam to a second side of the ion beam.

15. The substrate heating and processing system of claim 14, wherein the one or more operating parameters are selected from the group consisting of target substrate temperature, platen temperature, ion beam energy, substrate material and scan rate.

16. The substrate heating and processing system of claim 14, wherein the plurality of LEDs emit light at a wavelength between 0.4 and 1.0 µm.

17. The substrate heating and processing system of claim 14, wherein the power level applied to the plurality of LEDs by the controller varies based on a position of the platen relative to the ion beam.

* * * * *